United States Patent [19] [11] Patent Number: 5,853,489
Kitazawa [45] Date of Patent: Dec. 29, 1998

[54] CLEANING PROCESS

[75] Inventor: Kozo Kitazawa, Wakayama, Japan

[73] Assignee: Kao Corporation, Tokyo, Japan

[21] Appl. No.: 714,154

[22] PCT Filed: Mar. 13, 1995

[86] PCT No.: PCT/JP95/00416

§ 371 Date: Sep. 18, 1996

§ 102(e) Date: Sep. 18, 1996

[87] PCT Pub. No.: WO95/25606

PCT Pub. Date: Sep. 28, 1995

[30] Foreign Application Priority Data

Mar. 18, 1994 [JP] Japan .................................. 6-074254

[51] Int. Cl.[6] .............................. B08B 3/12; B08B 7/04;
B08B 3/00; B08B 9/00

[52] U.S. Cl. .................................... 134/1; 134/1; 134/10;
134/26; 134/22.14; 510/535

[58] Field of Search .................... 134/1, 26, 40,
134/10, 22.14, 22.19; 510/535

[56] References Cited

U.S. PATENT DOCUMENTS 5,350,457 9/1994 Kitazawa et al. ...................... 134/10

FOREIGN PATENT DOCUMENTS 0 535 689 A2 7/1993 European Pat. Off. .

Primary Examiner—Kenneth R. Horlick
Assistant Examiner—Joyce Tung
Attorney, Agent, or Firm—Birch, Stewart, Kolasch & Birch, LLP

[57] ABSTRACT

The present invention is directed to a process for cleaning a cleaning object, comprising the steps of: placing water and organic substances containing a nonionic surfactant composition having a cloud point of not higher than 100° C. in a ratio of not less than 30% by weight, with or without previous blending, in a cleaning vessel, wherein the organic substances have a specific gravity higher than that of water and, when mixed with water, placed in the cleaning vessel and kept standing at a temperature of from 20° to 100° C. for 30 minutes, exhibit phase separation such that not less than 50% by weight of the organic substances is separated into a lower layer; maintaining a temperature above the cloud point of the nonionic surfactant, thereby allowing water and the organic substances to be in the state of phase separation in which the concentration of the organic substances in a lower layer is higher than that in an upper layer; and cleaning the cleaning object in the lower layer.

13 Claims, 1 Drawing Sheet

CLEANING PROCESS

TECHNICAL FIELD

The present invention relates to a process for cleaning solid surfaces of glass, ceramics, metals, plastics, etc. Specifically, the present invention relates to a process for cleaning machine parts, electronic parts, precision parts, machine tools used for assembling or processing these parts, or the like, which are stained with fats and oils, machine oils, quenching oils, greases, cutting oils or other working oils, waxes, liquid crystals, fluxes, abrasion dusts, cutting dusts, or the like. More specifically, it relates to a process for cleaning wherein a dense detergent component with a high cleaning performance can be used without concern about fire, explosion and workplace environment pollution due to odor, etc.

BACKGROUND ART

Conventionally, chlorine-based solvents such as 1,1,1-trichloroethane and tetrachloroethylene, and chlorofluorocarbon solvents such as trichlorotrifluoroethane have been used for cleaning solid surfaces of glass, ceramics, metals, plastics, etc., e.g., surfaces of machine parts, electronic parts, precision parts, machine tools used for assembling or processing these parts, which are stained with fats and oils, machine oils, quenching oils, greases, cutting oils or other working oils, waxes, liquid crystals, fluxes, abrasion dusts, cutting dusts, or the like, because these solvents have a high cleaning performance and are easy to handle. Here, these parts and tools are collectively referred to as "machine and precision parts."

The use of detergents containing chlorofluorocarbon- or chlorine-based solvents is being reconsidered or totally banned or legally regulated, as they have proven to be potentially hazardous to the global environment and human life, due to ozone layer depletion, carcinogenesis, etc. caused by atmospheric evaporation or diffusion of the solvents, or subterranean water contamination therewith.

In response to this trend, various detergents or cleaning technologies that can replace such chlorofluorocarbon- or chlorine-based detergents have already been proposed. Typical examples include 1) the method using a hydrocarbon solvent, such as kerosene, toluene, xylene or petroleum solvent, or a detergent comprising such a hydrocarbon solvent and an appropriate amount of surfactant (Japanese Patent Laid-Open No. 3-94082);
2) the method using a glycol, a liquid nonionic surfactant of low viscosity, or a dense detergent liquid comprising such a substance and a small amount of water (Japanese Patent Laid-Open Nos. 3-62895 and 3-162496); and
3) the method using a detergent containing a surfactant and builder, the detergent being diluted with a large amount of water. However, all these cleaning methods are problematic as to a cleaning performance, cleaning workplace environmental protection and other factors.

For example, the cleaning methods 1) and 2) described above use a cleaning liquid wherein organic substances form a continuous phase. These methods exhibit an excellent cleaning performance against various types of organic stains including liquid organic substances, such as machine oils and metallurgic oils, and viscous or solid organic substances, such as grease and fluxes. Such an excellent cleaning performance of these methods may be explained by the cleaning mechanism of the detergents. Specifically, organic stains are removed by dissolving into the cleaning liquid, since the organic substances form a continuous phase in the cleaning liquid as in the case of chlorofluorocarbon-based solvents and 1,1,1-trichloroethane. However, the cleaning methods 1) and 2) have risks of catching fire, exploding, and polluting workplace environment due to evaporation of volatile organic components, such as hydrocarbon solvents and glycols, because organic substances form a continuous phase. Detergents containing an appropriate, small amount of water to prevent catching fire have no risk of fire, provided that the water content is appropriately controlled at the time of cleaning. However, these detergents need extra cost and personnel for controlling water content, i.e., analytical instrument and water supply facilities for controlling water, and personnel for their operation. In addition, the other problem, workplace environmental pollution due to evaporation of organic components remains unsolved.

Also, method 3), which uses a detergent containing a surfactant and builder, the detergent being diluted with a large amount of water, is desirable from the viewpoint of workplace environmental protection, because there is no risk of catching fire and pollution of workplace environment due to evaporation of organic components. However, unlike the cleaning methods 1) and 2), method 3) uses a cleaning liquid wherein water forms a continuous phase. In this method, cleaning is performed by a cleaning mechanism that the surfactant in water is adsorbed to the parts being cleaned or organic stains adhering thereon, and decreases their interfacial tensions to promote their self-aggregation, thereby allowing the aggregated organic stain to be removed by rolling-up motion. As compared with methods 1) and 2) in which organic stains are removed by dissolving into a detergent liquid, method 3) is considerably inferior in a cleaning performance against viscous grease and solid stains, such as fluxes and waxes.

In this situation, there is need for a new cleaning method which shows both an excellent cleaning performance against organic stains of various properties, as obtained with the detergents based on the dissolution mechanism in methods 1) and 2), and excellent properties for ensuring cleaning workplace safety, such as nonflammability and low volatility, as obtained with detergents diluted with water as exemplified by method 3).

EP-A-0466054 and EP-A-0535689 disclose methods for improving treatment efficiency of waste liquid by a detergent having a particular cloud point.

FR-A-2146633 and JP-A-2034683 disclose methods for cleaning in a state of phase-separation of cleaning liquid, wherein the cleaning is carried out in the lower organic solvent phase.

DISCLOSURE OF INVENTION

An object of the present invention is to provide a cleaning process which achieves both an excellent cleaning performance against organic stains of various properties, and high safety in cleaning workplace, including nonflammability and low volatility.

In order to achieve the above object, the present inventors made extensive investigation, and found that an excellent cleaning performance and high safety in workplace environment can be achieved by the following cleaning process comprising the steps of:

placing water and organic substances, with or without previous blending, in a cleaning vessel, the organic substances having a specific gravity higher than that of water and being capable of exhibiting phase separation to water;

allowing water and the organic substances to be in the state of phase separation in which the concentration of the organic substances in a lower layer is higher than that in an upper layer; and cleaning a cleaning object in the lower layer. An excellent cleaning performance can be obtained because this method allows the cleaning object to be in contact with the dense liquid of organic substances which form the oil phase as the lower layer, and high workplace safety is achieved because the upper water layer prevents the organic substances from evaporating and catching fire. Based upon these findings, the inventors made further investigations, and developed the present invention.

Specifically, the present invention is concerned with the followings:

(1) A process for cleaning a cleaning object, comprising the steps of:
placing water and organic substances, with or without previous blending, in a cleaning vessel, the organic substances having a specific gravity higher than that of water and being capable of exhibiting phase separation to water;
allowing water and the organic substances to be in the state of phase separation in which the concentration of the organic substances in a lower layer is higher than that in an upper layer; and
cleaning the cleaning object in the lower layer;

(2) The process for cleaning described in (1) above, wherein ultrasonic wave, stirring or in-liquid jetting is applied to the upper and/or lower layers;

(3) The process for cleaning described in (1) or (2) above, wherein the cleaning object is pulled up from the upper layer and then rinsed by jetting or spraying water in a space above the upper layer;

(4) The process for cleaning described in any one of (1) to (3) above, wherein the organic substances, when mixed with water, placed in the cleaning vessel and kept standing at a temperature of from 20° to 100° C. for 30 minutes, exhibit phase separation such that not less than 50% by weight of the organic substances is separated into the lower layer;

(5) The process for cleaning described in (4) above, wherein 80 to 99.9% by weight of the organic substances is separated into the lower layer;

(6) The process for cleaning described in any one of (1) to (5) above, wherein main components of the organic substances are one or more kinds selected from the group consisting of nonionic surfactants; aromatic hydrocarbon compounds; and esters, ethers, alcohols and ketones, each having an aromatic hydrocarbon group;

(7) The process for cleaning described in any one of (1) to (6) above, wherein the organic substances contain a nonionic surfactant having a cloud point of not higher than 100° C. in a ratio of not less than 30% by weight; and (8) The process for cleaning described in (7) above, wherein the nonionic surfactant having a cloud point of not higher than 100° C. is a compound represented by the formula:

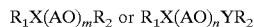

wherein $R_1$ represents a hydrocarbon group having 6 to 18 carbon atoms that may have a substituent and that has at least one aromatic ring; $R_2$ represents a hydrogen atom or a hydrocarbon group having 1 to 10 carbon atoms that may have a substituent; X represents an ether group, an ester group or an amino group; Y represents an ether group or an ester group; (AO) represents an alkylene oxide having 2 to 4 carbon atoms; m and n are average molar addition numbers of (AO), m being 0 to 20 and n being 1 to 20.

BEST MODE FOR CARRYING OUT THE INVENTION

Figure 1:
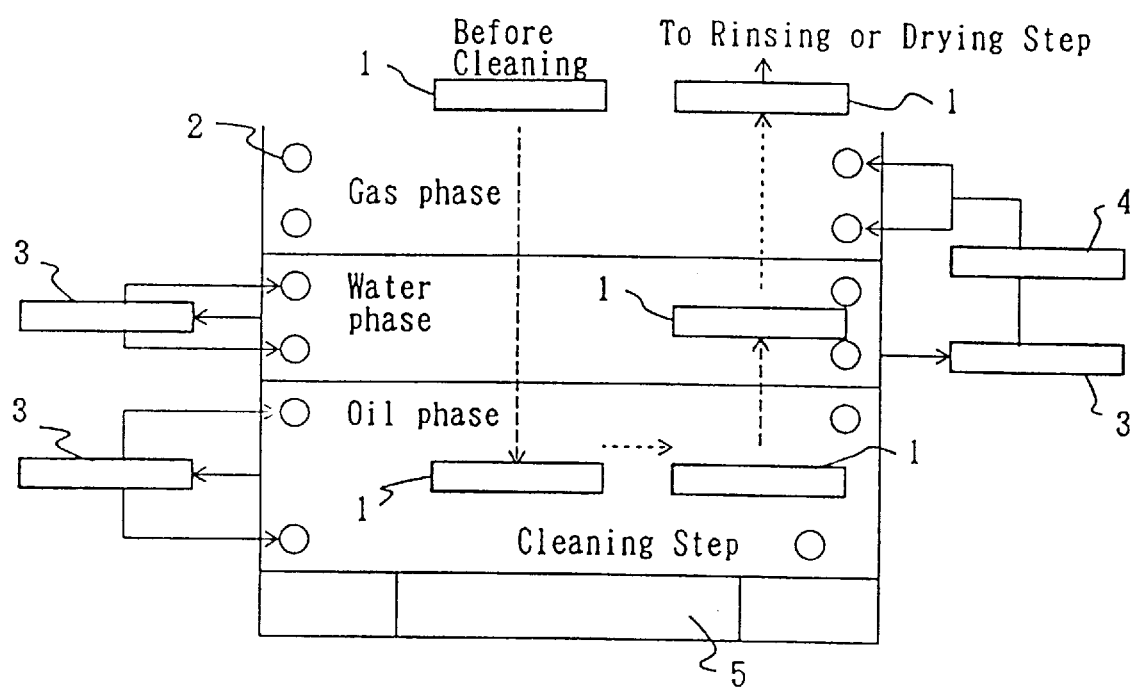
FIG. 1 is a schematic diagram of the cleaning vessel of a cleaning apparatus used for the cleaning process of the present invention, in which the numerical symbols represent the following: 1, work piece; 2, jetting nozzle; 3, pump; 4, recycle treatment devise; 5, ultrasonic oscillator.

The cleaning process of the present invention is characterized in that water and organic substances whose specific gravity, as a whole, is higher than that of water and which are, as a whole, capable of exhibiting phase separation to water are placed in a cleaning vessel, with or without previous blending (the thus-obtained mixture is hereinafter referred to as "cleaning liquid"), and the cleaning object is cleaned in the lower layer, while the cleaning liquid is in the state of phase separation in which the organic substance concentration in the lower layer is higher than that in the upper layer.

Accordingly, any cleaning liquid can be used as long as it comprises water and organic substances having a specific gravity higher than that of water and being capable of exhibiting phase separation to water, and shows phase separation such that the organic substance concentration in the lower layer (oil phase) is higher than that in the upper layer (water phase) when they are placed in a cleaning vessel with or without previous blending.

Preferred examples of the organic substances include compounds having a specific gravity of not less than 1.000 at 20° C. Although these organic compounds may or may not contain halogen atoms, halogen-free organic substances are preferred to halogen-containing compounds, such as fluorine compounds [e.g., hydrochlorofluorocarbon (HCFC), hydrofluorocarbon (HFC)], chlorine compounds (e.g., chlorinated paraffin, trichloroethylene) and bromine compounds (e.g., bromobenzene, bromoether benzene), from the viewpoint of environmental protection, safety and other factors.

Accordingly, suitably useful organic substances containing no halogen atoms mainly contain one or more substances selected from the group consisting of nonionic surfactants; aromatic hydrocarbon compounds; and esters, ethers, alcohols and ketones, each having an aromatic hydrocarbon group.

More specifically, compounds consisting of plural elements selected from carbon, hydrogen, oxygen and nitrogen are useful. Such compounds include ketones such as dimethoxyphenylacetone and acetophenone; epoxides, such as styrene oxide, phenyl glycidyl ether, glycidol, polypropyleneglycol diglycidyl ether, ethyleneglycol diglycidyl ether and neopentylglycol diglycidyl ether; esters, such as triallyl trimellitate, tetrahydrofurfuryl acrylate, trimethylolpropane triacrylate, butanediol diacrylate, benzyl methacrylate, methyl salicylate, diethyl phthalate, dibutyl phthalate, dimethyl adipate, dimethyl malate, tributyl citrate, tributyl trimellitate and benzyl benzoate; alcohols, such as phenoxyethanol, butylcatechol, 1,4-butanediol, isoeugenol, cinnamic alcohol, benzyl alcohol and dibenzylphenol; polyalkylene glycols, such as polypropylene glycol and polypropylene polyethylene copolymer; ethers, such as dibenzyl ether; and hydroxyethylpiperazine, epichlorohydrin, anisaldehyde, phenyl ethyl acetal, and ester, ketone and alkylene oxide derivatives thereof.

Preferable glycol ethers are polypropylene glycol, polypropylene polyethylene copolymer and other polyalkylene glycols having a molar addition number of 3 to 50, and alkyl ethers and alkyl esters thereof.

Organic substances containing halogen atoms include compounds obtained by replacement of some or all of the hydrogen atoms with halogen atoms, the hydrogen atoms being bound to the carbon atoms of chain hydrocarbons; aromatic or alicyclic hydrocarbons; hydrocarbons containing an aromatic or alicyclic hydrocarbon; alcohols, fatty acids, and amines, each being derived therefrom; ethers, esters, ketones, and amides, each resulting from reaction each other; and ethylene oxides, propylene oxides and other alkylene oxide adducts of these alcohols, fatty acids and amines.

Examples of compounds obtained by replacement of some or all of the hydrogen atoms with halogen atoms, the hydrogen atoms being bound to the carbon atoms of chain hydrocarbons, aromatic or alicyclic hydrocarbons, or hydrocarbons containing an aromatic or alicyclic hydrocarbon include chlorocyclohexane, dichlorobenzyl, dichloroxylene, chlorotoluene, chlorinated naphthalene, bromobenzene, dibromobenzene, trichlorobenzene, fluorostyrene, fluorotoluene, 1,5-dichloropentane, 1,4-dibromobutane and octyl bromide.

Examples of compounds obtained by replacement of some or all of the hydrogen atoms with halogen atoms, the hydrogen atoms being bound to the carbon atoms of alcohols and fatty acids derived from chain hydrocarbons, aromatic or alicyclic hydrocarbons, or hydrocarbons containing an aromatic or alicyclic hydrocarbon; and ethers, esters, and ketones, each resulting from reaction each other include chlorobenzyl alcohol, 2,3-dibromo-1-propanol, fluorophenol, chlorophenol, dichlorophenol, p-chloroacetophenone, methyl o-bromobenzoate, ethyl 2-bromoisobutyrate, decabromodiphenyl ether and α-bromobutyric acid.

Examples of organic substances containing halogen atoms also include compounds synthesized by subjecting the OH group of chlorobenzyl alcohol, 2,3-dibromo-1-propanol, fluorophenol, chlorophenol, dichlorophenol, or the like, to addition polymerization with ethylene oxide or propylene oxide, provided that the above-mentioned properties of the cleaning liquid of the present invention are not affected.

The boiling point of the organic substances mentioned above is preferably not less than 100° C. under atmospheric pressure, more preferably not less than 150° C. This is because vaporization of the detergent components during cleaning and drying steps should preferably be avoided in view of protection of environment and workplace atmosphere.

Any of these organic substances may be used singly or in combination.

In the present invention, it is preferable to use such organic substances containing a nonionic surfactant having a cloud point of not higher than 100° C., more preferably not higher than 60° C., in a ratio of not less than 30% by weight, more preferably 50 to 100% by weight.

These compounds have specific temperature known as a cloud point; i.e., they are soluble in water below a given temperature, because they have such a group as an ether group, an ester group or a hydroxyl group tending to become hydrophilic through hydrogen bond, and are insoluble above that temperature. It is therefore possible to form the two liquid layers essential for the method of the present invention. Specifically, an upper layer water phase and a lower layer oil phase can be formed, simply by heating the cleaning liquid containing such organic substances to a temperature above the cloud point, because the organic substances easily become insolubilized and separate in the cleaning liquid. Also, because the organic substances are soluble in water at temperatures below the cloud point, the portion of cleaning liquid adhering to the cleaning object, such as machine parts, at the time of cleaning, can easily be removed by rinsing with water at a temperature below the cloud point, so that the rinsing process is simplified.

In the present invention, from the viewpoint of degreasing ability and rinsability with water, preferred examples of the nonionic surfactant having a cloud point of not higher than 100° C. include a compound represented by the formula:

$$R_1X(AO)_mR_2 \text{ or } R_1X(AO)_nYR_2$$

wherein $R_1$ represents a hydrocarbon group having 6 to 18 carbon atoms that may have a substituent and that has at least one aromatic ring; $R_2$ represents a hydrogen atom or a hydrocarbon group having 1 to 10 carbon atoms that may have a substituent; X represents an ether group, an ester group or an amino group; Y represents an ether group or an ester group; (AO) represents an alkylene oxide having 2 to 4 carbon atoms; m and n are average molar addition numbers of (AO), m being 0 to 20 and n being 1 to 20.

Among them, in cases where $R_1$ is a hydrocarbon group having 6 to 10 carbon atoms and $R_2$ is a hydrogen atom, or a hydrocarbon group having 1 to 2 carbon atoms, or a hydrocarbon group having an aromatic ring, it is likely that excellent phase separation and an oil phase of which specific gravity is higher than that of a water phase are obtained. It is also preferable that m and n be 0 to 4 and 1 to 4, respectively, from the viewpoints of cleaning liquid viscosity and a cleaning performance in addition to the above features.

Examples of the compound represented by $R_1X(AO)_mR_2$ or $R_1X(AO)_nYR_2$ include ethylene oxide or propylene oxide adducts of phenol, styrenated phenol, benzylated phenol, cresol, benzyl alcohol or benzylamine, and methyl esters and methyl ethers thereof. Specifically, such compounds include poly(average molar addition number P=1 to 4)oxyethylene phenyl ether, poly(P=1 to 7)oxypropylene phenyl ether, poly(P=1 to 2)oxyethylene benzyl ether, poly(P=1 to 10)oxypropylene benzyl ether, poly(P=2)oxyethylene/poly(P=4)oxypropylene phenyl ether and methyl or benzyl ethers thereof.

The cleaning liquid used for the method of the present invention must exhibit phase separation such that a water phase is formed in the upper layer and an oil phase in the lower layer. For efficiently and quickly obtaining the two liquid layers, i.e., an upper layer water phase and a lower layer oil phase, the ratio of organic substances transferring to the lower layer of the cleaning liquid when the cleaning liquid is kept standing at a temperature of 20° to 100° C. for 30 minutes (separation rate), is preferably not lower than 50% by weight, more preferably not lower than 80% by weight of the total organic substances. Higher organic substance separation rates are preferred, since the risk of fire and environmental pollution factors, such as odor, are reduced, because the amount of organic substances remaining in the water phase decreases. However, in view of rinsing efficiency after cleaning, the organic substances soluble to a certain extent in water are preferred; in this sense, it is preferable that the upper limit of separation rate is 99.9% by weight, more preferably 99% by weight.

Accordingly, in the method of the present invention, it is preferable that when the organic substances are placed in a cleaning vessel after blended with water and kept standing at a temperature of from 20° to 100° C. for 30 minutes, the organic substances exhibit phase separation such that not less than 50% by weight, more preferably 80 to 99.9% by weight thereof is separated into the lower layer.

The term "organic substance" as used herein refers to a compound used as a detergent component and having a TOC (total organic carbon) value. Basically, TOC values can be determined by the method of combustion-infrared analysis described under "Total Organic Carbon (TOC)" in JIS-KO102 "Testing Methods for Industrial Waste Water", using TOC-500 (manufactured by Shimadzu Corporation), for instance. The organic substance separation rate in the cleaning liquid, i.e., the ratio of organic substances transferring to the lower layer of the cleaning liquid, as described above, is obtained by dividing the TOC value of the cleaning liquid in the lower layer by the sum of the TOC values of the cleaning liquids in the lower and upper layers, and multiplying the quotient by a factor of 100, and is expressed in % values.

The cleaning liquid used in the present invention may optionally contain various surfactants, organic or inorganic chelating agents, builders, silicone oil defoaming agents, amine rust preventives, antiseptics, alkanolamines (e.g., diethanolamine, methyldiethanolamine), alcohols, petroleum solvents, etc., in addition to the above-mentioned organic substances, as long as the essential properties of the cleaning liquid of the present invention are not lost. When a surfactant other than the above-mentioned surfactants is used in the present invention, it is preferable that the surfactant is a nonionic surfactant having an appropriate cloud point and a specific gravity of less than 1.000, which is not likely to affect parts reliability for electric properties, or cause quality deterioration, such as rusting, because of the absence of inorganic ions.

Examples of the optionally usable nonionic surfactants include ether type surfactant such as alkyl ether, and alkyl allyl ether; alkyl ester type; amine-condensed type such as polyoxyalkylene alkylamine; amide-condensed type such as polyoxyalkylene alkylamide; Pluronic or Tetronic types produced by random or block condensation of polyoxyethylene with polyoxypropylene; and polyethyleneimine-based surfactants.

The cleaning process of the present invention is characterized in that the above-described cleaning liquid is used to clean the cleaning object in contact with the lower layer of the cleaning liquid, while the cleaning liquid is in phase separation such that the concentration of the organic substances in the lower layer is higher than that in the upper layer. The cleaning object, i.e., machine and precision parts, is cleaned by, for example, immersing the cleaning object in the lower layer for a given period of time. In this case, for obtaining a sufficient cleaning performance, it is preferable that the entire cleaning object is in contact with the lower layer oil phase. Specifically, a better cleaning performance can be obtained, when the cleaning object is sufficiently immersed in the oil phase. Although the oil phase may be continuous or in the form of droplets, it is preferable to carry out cleaning, while a continuous oil phase is contained, from the viewpoint of both a cleaning performance and workplace environment.

FIG. 1 shows a schematic diagram of the cleaning vessel of a cleaning apparatus used for the cleaning process of the present invention. A better cleaning performance can be obtained, when a mechanical force or physical force, such as ultrasonication, stirring or in-liquid jetting, is applied to the cleaning liquid during cleaning. FIG. 1 exemplifies a case in which each layer is stirred by circulating the water and oil phases using a pump (3). For protecting the workplace environment, it is preferable that the mechanical force etc. be applied to the extent that the lower layer oil phase does not appear on the upper surface of the upper layer water phase, so that odor etc. can be suppressed.

It is preferable, from the viewpoint of cleaning efficiency that the oil phase depth in the cleaning vessel be set at a level such that the entire machine and precision parts are immersed. Also, the water phase depth is set at a level such that the oil phase surface is fully covered therewith for maintaining a good workplace environment. However, it is preferable that the depth be at least such that the entire machine and precision parts can be almost immersed, when the water phase is used for rinsing. When the water phase is used for rinsing, it is preferable to apply a mechanical force or physical force, such as ultrasonication, stirring or in-liquid jetting, as in the case of cleaning in the oil phase. These means, e.g., ultrasonication and stirring, may be performed at the same time, and the water and oil phases may be so treated at the same time.

It is preferable that oily or solid stains contaminating in the water phase be removed using various separation devices, such as filters and oil-water separators, arranged in the circulatory system, so that a better cleaning performance is ensured. Solid stains in the oil phase can also be removed in the same manner as stains in the water phase.

In the present invention, the cleaning object may be rinsed by jetting or spraying water thereto in the space above the upper layer after the cleaning object is pulled up from the upper layer. In this case, for example, by rinsing the machine and precision parts with rinsing water jetted or sprayed from 1 or more outlets, normally 1 to 20 outlets (nozzles) (2) arranged above the surface of the water phase in the cleaning vessel, satisfactory rinsing can be achieved even at low water phase depths. This makes it possible to reduce the size of the entire cleaning apparatus. The rinsing water used for this purpose may be any one of pure water, tap water, circulated water, and water recycled from the water phase by a recycle treatment devise (4) such as an oil-water separator using activated charcoal, membrane, or vaporization. Where necessary, the lower layer oil phase can be jetted from such nozzles, while being circulated using a pump.

The cleaning vessel used may be of the single-vessel type or the multiple-vessel type; in the latter case, a number of cleaning vessels based on the same cleaning method are used. Where necessary, the cleaning vessel may be used in combination with a conventional cleaning method in common use. The in-line method, in which the cleaning object is continuously cleaned, while being transported using a belt conveyor etc., or the barrel method may be used. The present invention is applicable to all known cleaning methods.

The cleaning process of the present invention can be used for cleaning solid surfaces of glass, ceramic, metals, plastics, etc. The cleaning process of the present invention is especially effective for cleaning machine parts, electrical parts, precision parts and machine tools which are used for assembling and processing these parts. Here, examples of the precision parts include electronic parts, electrical parts, precision instrument parts, formed resin parts, optical parts and the like. Illustrative examples of the electronic parts include printed wiring boards for use in electronics-aided instruments such as computers and peripheral devices thereof, domestic electrical instruments, communications instruments, OA instruments and the like; hoop materials for use in contact parts such as IC lead frames, resistors, condensers, relays and the like; liquid crystal displays for use in OA instruments, clocks, computers, toys, domestic electrical instruments and the like; magnetic recording parts for use in recording/reproduction of image or sound and related parts thereof; semi-conductor materials such as silicon or ceramic wafers and the like; parts for electrostriction use such as quarts oscillators and the like; and photoelectric transfer parts for use in CD, PD, copying instruments, optical recording instruments and the like. Illustrative examples of the electrical parts include motor parts such as a brush, a rotor, a stator, a housing and the like; ticket delivery parts for use in vending machines and various other instruments; and coin-checking parts for use in vending machines, cash dispensers and the like. Illustrative examples of the precision instrument parts include bearings for use in precision drivers, video recorders and the like; and parts for processing use such as super hard tips and the like. Illustrative examples of the formed resin parts include precision resin parts for use in cameras, cars and the like. Illustrative examples of the optical parts include lenses for use in cameras, eyeglasses, optical instruments and the like, in addition to other related parts such as spectacle rims, clock housings, watch bands and the like. Illustrative examples of the machine parts include gears, camshaft springs, shafts, bearings, and other parts used in automobile engines and actuators. Illustrative examples of the electrical parts include motors, e.g. those used in video players, plastic products, electron guns, and shadow masks. Illustrative examples of the machine tools include those which are used in respective steps for manufacturing, molding, processing, assembling, finishing and the like of the precision parts described above, as well as various types of instruments and parts thereof that are used for the handling of precision parts.

Though the cleaning process of the present invention is useful especially for cleaning flux-stained printed wiring boards, crystalline liquid-stained glass substrates and the like, the inventive cleaning process can be applied to any type of machine and precision parts as long as these parts have solid surfaces stained with various types of working oils, fluxes and the like which may interfere the later treatments in assembling and processing steps, or with various types of oily foul substances which may deteriorate the characteristic properties of the final products. The cleaning process of the present invention exerts its characteristic effect especially when the foul substances are mainly organic oily substances such as fats and oils, machine oils, quenching oils, cutting oils, greases, liquid crystals, rosin-based fluxes and the like. Such foul substances can be removed effectively even when they are contaminated with metal powders, inorganic powders and the like, because these powders are removed together with removal of the organic oily substances.

The present invention is hereinafter described in more detail by means of the following working examples and comparative examples, but is not limited by these examples. The cloud points shown in the Examples were determined as a temperature at which a 1% by weight aqueous sample liquid (deionized water used) became cloudy.

Examples 1 through 9 and Comparative Examples 1 through 3

Cleaning liquids comprising the compositions shown in Table 1 are prepared. Each liquid is diluted with deionized water to organic substance content of 50% by weight. Seven liters of this dilution is placed in a cleaning apparatus (cleaning vessel illustrated in FIG. 1) having a 10-liter capacity and equipped with an ultrasonic oscillator and mechanical stirrer, and is kept standing for 30 minutes at a temperature set between 20° and 100° C. (30° C. for Examples 2, 5, 6 and 7; 80° C. for Example 4; 70° C. for Examples 8 and 9; 50° C. for the other Examples).

Thirty minutes later, samples are taken from the surface of the cleaning liquid and lower layers in the cleaning vessel. The organic substance content in the cleaning liquid is determined from the TOC value (Shimadzu TOC-500 used) to calculate the separation rate.

In Examples 1 through 9, it is shown that at given temperatures between 20° and 100° C., not less than 50% by weight of the organic substances contained are separated from the aqueous liquid, resulting in the formation of a water phase in the upper layer and an oil phase comprising dense organic substance liquid in the lower layer. Correspondingly, the organic substance odor generated from the cleaning liquid decreases markedly after phase separation.

On the other hand, in Comparative Example 1, although 85% by weight of the organic substances are separated from the aqueous liquid at 50° C., stronger odor is generated after phase separation, because an oil phase is formed in the upper layer, and a water phase in the lower layer. The upper layer oil phase in Comparative Example 1 has a flashing point of 71° C. In Comparative Example 2, an oil phase is formed as a thin upper layer, and a water phase as the lower layer, with stronger odor generated after phase separation. In Comparative Example 3, the cleaning liquid used is the same as in Example 1.

Next, the following test materials are cleaned using the above cleaning liquid after being kept standing for 30 minutes. 1) Test material 1: a steel test piece (10 cm×15 cm), coated (10 g/m$^2$) with a naphthene mineral oil (40° C., 350 cst), 2) test material 2: a glass substrate (10 cm×10 cm), coated (5 g/m$^2$) with a liquid crystal, and 3) test material 3: a printed board (10 cm×15 cm), treated with a rosin flux. During cleaning, each test piece is kept in fully contact with the oil phase, except that in Comparative Example 3; the test piece is cleaned in the absence of phase separation by stirring the entire cleaning liquid.

Cleaning is performed at a temperature of 50° C. in the lower layer for 0.5 minutes under ultrasonication conditions. The test piece is then transferred to the upper layer and ultrasonically rinsed for 0.5 minutes, after which it is taken out from the cleaning vessel and dried at 80° C. for 15 minutes. The cleaning performance of the cleaning liquid, determined on the basis of the test piece weight change noted after cleaning, is expressed using the following equation:

$$\frac{I - II}{I - III} \times 100$$

wherein I stands for weight of test piece before cleaning; II stands for weight of test piece after cleaning; and III stands for weight of untreated test piece.

The obtained values are evaluated using the following 4-grade rating:

≧90: ⊚ (excellent)
75–89: ○ (good)
60–74: Δ (fair)
<60: x (poor)

TABLE 1

| Detergent Composition & Evaluation Items | | Cloud Point (°C.) | Examples | | | | | | | | | Comparative Examples | | |
|---|---|---|---|---|---|---|---|---|---|---|---|---|---|---|
| | | | 1 | 2 | 3 | 4 | 5 | 6 | 7 | 8 | 9 | 1 | 2 | 3 |
| Components & Amounts (% by weight) | Dibenzyl ether | 10> | | | | | | | 89 | | | 20 | | 95 |
| | Phenol (EO)$_3$ | 35 | 95 | | | 25 | | 20 | | | | | | |
| | Benzyl alcohol (EO)$_1$ | 10> | | 60 | | | | | 3 | | | | | |
| | Benzyl alcohol (PO)$_2$ | 10> | | | | 35 | 70 | | | | | | | |
| | Benzyl alcohol | 10> | | 10 | | | | | | | | | | |
| | Styrenated phenol (EO)$_4$ | 10> | | | | 25 | | | | | | | | |
| | (PO)$_{10}$ (EO)$_4$ | 10> | | | 65 | | | | | | | | | |
| | Phenol (PO)$_5$ (EO)$_2$ | 10> | | 30 | | | | | | | | | | |
| | Phenyl ethyl acetal | 10> | | | 30 | | | | | | | | | |
| | Butyl alcohol (EO)$_2$ | 100< | | | | | 30 | | 5 | | | | 70 | |
| | Octyl alcohol (EO)$_4$ | 10> | | | | | | 5 | | | | | | |
| | Paraffin (Av. number of carbon atoms = 10) | 10> | | | | | | | | | | 65 | 10 | |
| | Dibutyl phthalate | 10> | | | | | | 76 | | | | | | |
| | Diethanolamine | 100< | | | 1 | | | | 1 | 5 | | | | |
| | Oleyl alcohol (EO)$_{10}$ | 58 | 5 | | | 15 | | | 2 | | 5 | 15 | 10 | 5 |
| | Sodium dodecylbenzenesulfonate | 100< | | | | | | | | | | | 10 | |
| | Chlorophenol (EO)$_4$ | 53 | | | | | | | | 95 | 25 | | | |
| | p-Chloroacetophenone | 10> | | | | | | | | | 45 | | | |
| | Methyl o-bromobenzoate | 10> | | | | | | | | | 25 | | | |
| | Cloud Point(°C.) of the compositions | | 38 | 10> | 10> | 15 | 10> | 10> | 10> | 54 | 10> | 10> | 100< | 38 |
| Separation Ratio (%) | TOC in lower layer/(TOC in lower layer + TOC in upper layer) × 100 | | 95 | 98 | 83 | 91 | 68 | 90 | 87 | 96 | 97 | 15 | 45 | 95 |
| Odor of Cleaning Liquid | Before phase separation | | B | B | B | B | B | B | B | C | C | B | B | B |
| | After phase separation | | D | D | D | D | C | C | D | D | D | A | B | D |
| Cleaning Performance | Ultrasonic cleaning after 30-minutes standing | | ◎ | ◎ | ◎ | ◎ | ○~◎ | ◎ | ◎ | ◎ | ◎ | X~Δ | Δ | — |
| | Ultrasonic cleaning with stirring | | — | — | — | — | — | — | — | — | — | — | — | Δ~○ |

(EO)$_n$: Ethylene oxide adduct (PO)$_n$: Propylene oxide adduct n: Average molar addition No. A: Extremely strong B: Strong C: Medium D: Slight In Examples 1 through 9, a good cleaning performance is obtained. In Comparative Example 1, no satisfactory cleaning performance is obtained, because a large amount of the surface layer oil phase is adhered to the test piece, when the test piece is pulled up from the cleaning liquid. In Comparative Example 2, the cleaning performance was insufficient, because the oil phase, a dense organic substance phase, does not form smoothly. In Comparative Example 3, the cleaning performance lowers, despite the use of the same cleaning liquid as in Example 1, because the entire cleaning liquid is uniformly stirred using a mechanical stirrer during the cleaning test.

Also, in Examples 1 through 9, when the test piece is rinsed for 0.5 minutes by jetting water recycled from the water phase with a recycle treatment devise at a pressure of 1 kg/cm$^2$, after being pulled out from the water phase and before drying, the cleaning performance increases by a factor of 1.5 to 5, in comparison with the absence of this operation.

INDUSTRIAL APPLICABILITY

According to the cleaning process of the present invention, the risk of fire, explosion, etc. following flashing, and workplace environmental pollution, such as odor generation, due to organic substance volatilization, are prevented, because the upper layer of the cleaning liquid is constantly a water phase. Moreover, a high cleaning performance against various liquid or solid organic stains is ensured, because the dense detergent liquid forming an oil phase as the lower layer serves for cleaning. As a result, a good cleaning effect is also obtained against inorganic stains, such as wear dusts, which are present along with organic stains.

I claim:

1. A process for cleaning a cleaning object, comprising the steps of:
placing water and organic substances containing a nonionic surfactant composition having a cloud point of not higher than 100° C. in a ratio of not less than 30% by weight, with or without previous blending, in a cleaning vessel, wherein the organic substances have a specific gravity higher than that of water and, when mixed with water, placed in the cleaning vessel and kept standing at a temperature of from 20° to 100° C. for 30 minutes, exhibit phase separation such that not less than 50% by weight of the organic substances is separated into a lower layer;
maintaining a temperature above the cloud point of the nonionic surfactant, thereby allowing water and the organic substances to be in the state of phase separation in which the concentration of the organic substances in a lower layer is higher than that in an upper layer; and
cleaning the cleaning object in the lower layer.

2. The process according to claim 1, wherein ultrasonic wave, stirring or in-liquid jetting is applied to the upper and/or lower layers.

3. The process according to claim 1, wherein the cleaning object is pulled up from the upper layer and then rinsed by jetting or spraying water in a space above the upper layer.

4. The process according to claim 1, wherein 80 to 99.9% by weight of the organic substances is separated into the lower layer.

5. The process according to claim 1, wherein the organic substances further comprise one or more aromatic hydrocarbon compounds, esters having an aromatic hydrocarbon group, ethers having an aromatic hydrocarbon group, alcohols having an aromatic hydrocarbon group or ketones having an aromatic hydrocarbon group.

6. The process according to claim 1, wherein the nonionic surfactant having a cloud point of not higher than 100° C. is a compound represented by the formula:

$R_1X(AO)_mR_2$ or $R_1X(AO)_nYR_2$ wherein $R_1$ represents a hydrocarbon group having 6 to 18 carbon atoms that may have a substituent and that has at least one aromatic ring; $R_2$ represents a hydrogen atom or a hydrocarbon group having 1 to 10 carbon atoms that may have a substituent; X represents an ether group, an ester group or an amino group; Y represents an ether group or an ester group; (AO) represents an alkylene oxide having 2 to 4 carbon atoms; m and n each is an average molar addition number of (AO), m being 0 to 20 and n being 1 to 20.

7. The process according to claim 1, further comprising the step of rinsing the cleaning object in the upper layer.

8. The process according to claim 2, wherein the cleaning object is pulled up from the upper layer and then rinsed by jetting or spraying water in a space above the upper layer.

9. The process according to claim 2, further comprising the step of rinsing the cleaning object in the upper layer.

10. The process according to claim 3, further comprising the step of rinsing the cleaning object in the upper layer.

11. The process according to claim 4, further comprising the step of rinsing the cleaning object in the upper layer.

12. The process according to claim 5, further comprising the step of rinsing the cleaning object in the upper layer.

13. The process according to claim 6, further comprising the step of rinsing the cleaning object in the upper layer.

* * * * *